United States Patent [19]

Fu et al.

[11] Patent Number: 4,843,608

[45] Date of Patent: Jun. 27, 1989

[54] CROSS-COUPLED CHECKING CIRCUIT

[75] Inventors: Peter L. Fu, Sunnyvale; Daniel E. Lenoski, Mountain View, both of Calif.

[73] Assignee: Tandem Computers Incorporated, Cupertino, Calif.

[21] Appl. No.: 39,565

[22] Filed: Apr. 16, 1987

[51] Int. Cl.$^4$ ............................................. G06F 11/16
[52] U.S. Cl. ........................................ 371/68; 371/37
[58] Field of Search ..................... 371/68, 37, 9, 49, 7, 371/8

[56] References Cited

U.S. PATENT DOCUMENTS

| | | |
|---|---|---|
| 3,517,174 | 6/1970 | Ossfeldt . |
| 3,557,315 | 1/1971 | Kobus . |
| 3,833,798 | 9/1974 | Huber et al. . |
| 3,848,116 | 11/1974 | Moder et al. . |
| 3,882,455 | 5/1975 | Heck et al. . |
| 3,978,327 | 8/1976 | Huber . |
| 4,031,375 | 6/1977 | Jaskulke et al. . |
| 4,176,258 | 11/1979 | Jackson . |
| 4,233,682 | 11/1980 | Liebergot ............................. 371/68 |
| 4,453,215 | 6/1984 | Reid .................................... 364/200 |
| 4,541,094 | 9/1985 | Stiffler ................................ 371/68 |
| 4,723,245 | 2/1988 | Leslie ................................ 371/68 X |

OTHER PUBLICATIONS

Siewiorek, David P. & David Johnson, "A Design Methodology for High Reliability Systems: The Intel 432", *The Theory and Practice of Reliable System Design*, Chapter 18, pp. 621–636, Digital Press, Bedford, Massachusetts.

Ajmera, Dhaval, Ole Moller & David Sorensen, "Bipolar Building Blocks Deliver Supermini Speed to Microcoded Systems", *Electronic Design*, pp. 230–246, Nov. 15, 1984.

Wakerly, John, *Error Detecting Codes, Self-Checking Circuits and Applications*, Chapter 1, "Introduction", pp. 1–8, 1978, North-Holland, New York.

Tamir, Yuval, *Fault Tolerance for VLSI Multicomputers*, Chapter Three, "Error Detection in Multicomputers", Report No. UCB/CSD, 86/256, pp. 39–49, Sep. 1985, Computer Science Division (EECS), University of California, Berkeley, California.

Primary Examiner—Jerry Smith
Assistant Examiner—Robert W. Beausoliel
Attorney, Agent, or Firm—Townsend and Townsend

[57] ABSTRACT

A cross-coupled checking circuit is disclosed in which two identical integrated circuit chips are configured in a complementary manner and connected in parallel to the same inputs and outputs. One chip drives the data output data and the other chip drives the check symbol output corresponding to the output data. Each chip generates internal results and compares them to the output driven by the other chip.

15 Claims, 2 Drawing Sheets

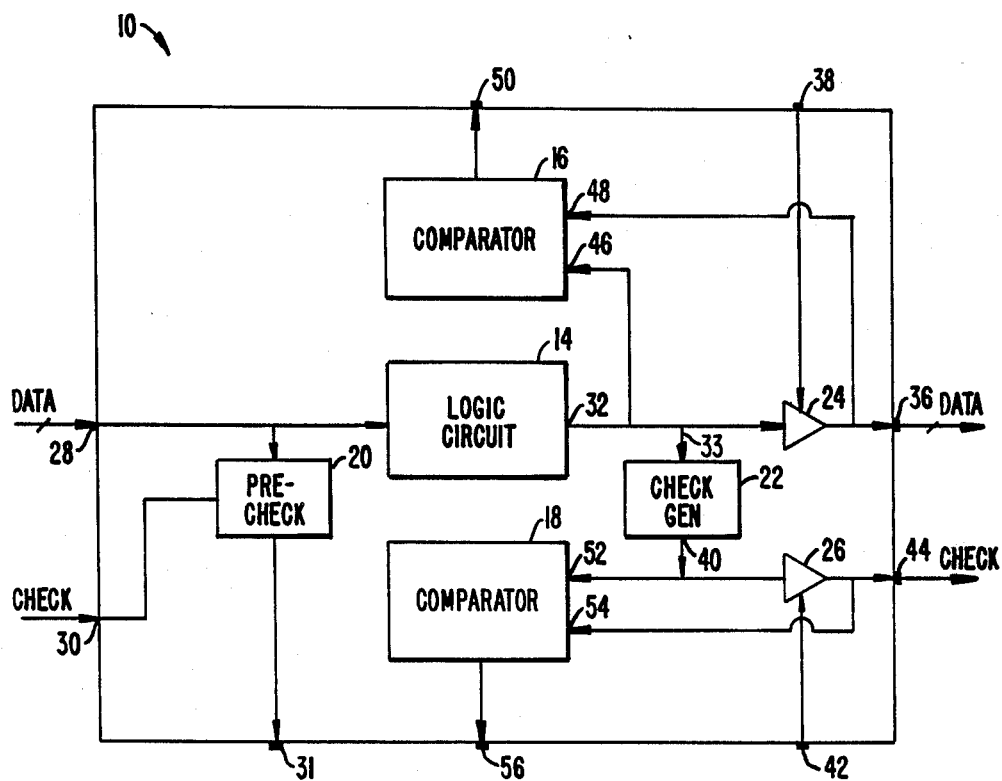
FIG._1.

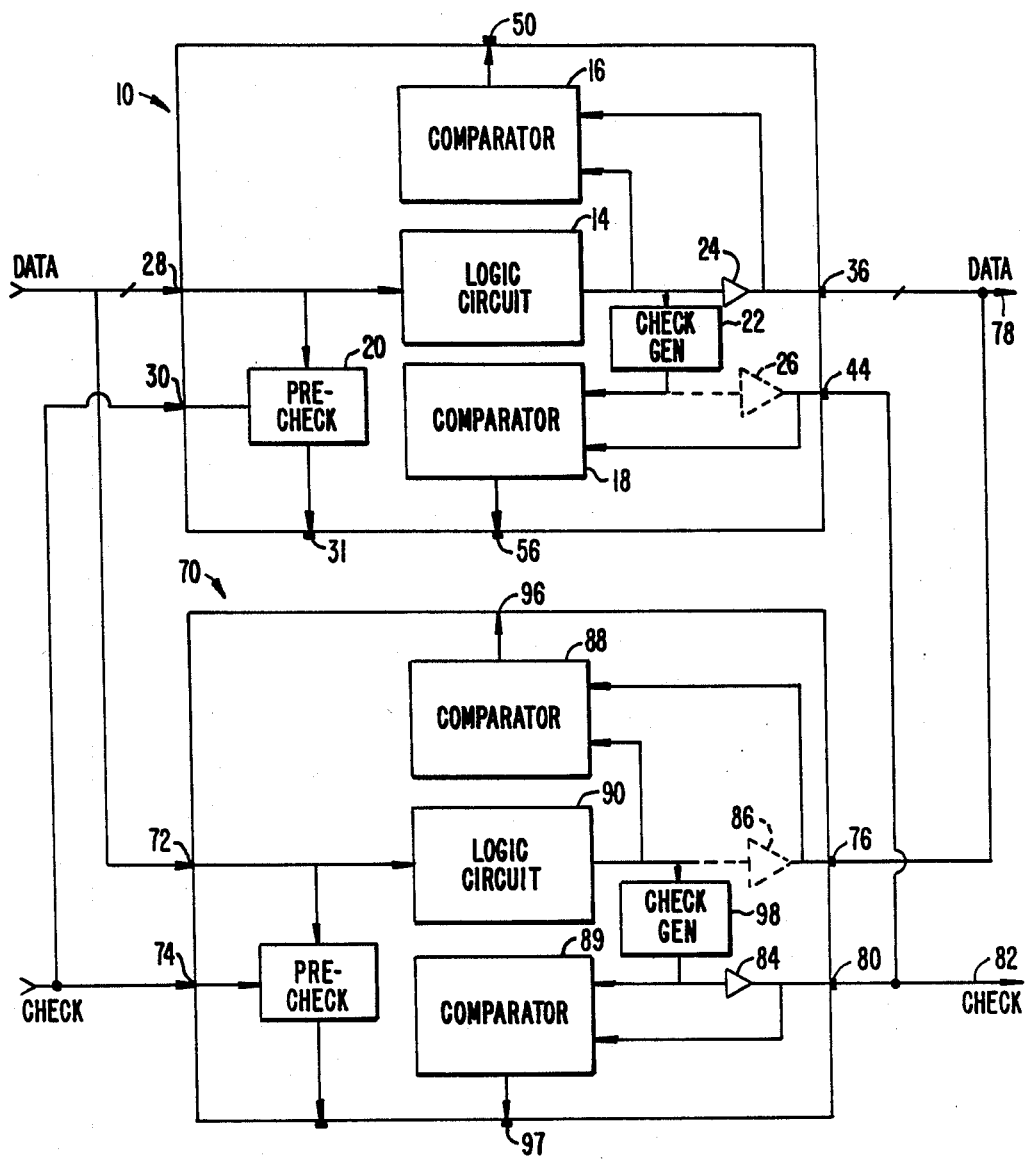
FIG._2.

CROSS-COUPLED CHECKING CIRCUIT

BACKGROUND OF THE INVENTION

1. Field of the Invention

This invention relates to fault detection circuits, and, more particularly, it relates to a circuit with two modules where each module checks the output of the other module.

2. Description of the Prior Art

Computers and other electronic systems comprise many interconnected modules. Such modules may be large scale functional units such as central processing unit, or they may be integrated circuit chips. The failure of any module can have catastrophic consequences, particularly if such failure is not immediately detected.

It is known in the art to employ duplicate modules and run them in close synchrony for the purpose of detecting faults. For example, duplicate modules are connected in such a manner as to receive identical inputs, and the outputs are compared by a third module which generates an error signal if the outputs disagree. The efficacy of such techniques is limited because they require a separate, off-chip part which is itself subject to latent failure. Undetected failures in the comparison circuit may prevent the discovery of faults in the module being checked.

Techniques have been developed to integrate the error detection circuitry into the duplicated module. For example, U.S. Pat. No. 4,176,258 discloses an integrated circuit chip with a logic circuit and a comparator. Two of these chips can be connected in parallel with one chip having its output enabled and the other chip having its output disabled. The disabled chip becomes a checker, or slave, comparing the output of the enabled master chip to its own internal logic results. This approach obviates the need for a third module while allowing for the use of two identical chips with a single part number. However, it does not provide a way to detect faults in the checker during normal operation. If the checker fails, either in its entirety or in its comparison circuit, faults in the master chip can go undetected.

SUMMARY OF THE INVENTION

According to the invention, a cross-coupled checking circuit comprises two modules, each of which generates a part of the circuit's output signal and checks the part generated by the other module for errors. Since both modules are active in producing the output and in checking the output, neither module is the master and neither is the slave, and a failure of either module will be detected by the other module.

In the preferred embodiment, one module generates output data and the other module generates a check symbol, or error detection code, corresponding to the output data. Each module also includes means for generating an internal result and means for comparing this internal result to the other module's output to check for errors.

Advantageously, the invention further provides a single integrated circuit chip, two of which can be cross-coupled to practice the invention. The chip includes a logic circuit, two comparators and two gating devices. The logic circuit has a data output and a check symbol output. The data output is connected to one input of the first comparator and to the input of the first gating device. The output of the first gating device is connected to an off-chip data output and also to the other input of the first comparator. The check symbol output is coupled to one input of the second comparator and to the input of the second gating device. The output of the second gating device is connected to an off-chip check symbol output and to the other input of the second comparator. The gating devices are independently controllable for either passing their input to their output or inhibiting their input and presenting a high impedance output.

Two of these identical integrated circuit chips can be connected in parallel and configured such that one chip drives the output data and the other chip drives the check symbol. This is done by configuring their gating devices in a complementary manner, with each chip having one gate enabled and one gate disabled. Then the chip which drives the output data checks the check symbol, while the chip which drives the check symbol checks the output data.

This approach is particularly appropriate for systems which already employ check symbols because the I/O pins and some of the error detection hardware are already in place. The technique can be extended to multiple input and output busses, each with their own data and check symbol divisions.

BRIEF DESCRIPTION OF THE FIGURES

FIG. 1 is a logic diagram of an integrated circuit chip for practicing the invention.

FIG. 2 is a logic diagram of two cross-coupled integrated circuit chips of the type shown in FIG. 1.

DESCRIPTION OF THE PREFERRED EMBODIMENT

Referring to FIG. 1, an integrated circuit chip 10 is shown. Chip 10 comprises a logic circuit 14, two equality comparators 16, 18, a prechecking circuit 20, a check symbol generator 22, and two drivers 24, 26. Prechecking circuit 20 receives the data and check symbol coming into the chip on off-chip data input 28 and off-chip check symbol input 30, respectively, and checks for errors. The check symbol may be any one of a number of error detection codes known in the art for ensuring the integrity of transmitted data. In this embodiment, the check symbol is a parity bit, and all data is represented by a digitally coded data signal of one or more bits. If the check symbol is not consistent with the data, then prechecking circuit 20 generates an error signal on off-chip precheck error output 31.

Logic circuit 14 may be any data processing means of arbitrary complexity for generating output data on logic circuit internal output line 32 in response to the input data received on chip data input 28. On line 32, and all other data lines in this embodiment, the bits of data are transmitted in parallel. Check symbol generator 22 receives the logic circuit output data on line 32 via line 33 and generates a check symbol corresponding to this data. Check symbol generator 22 may in fact be part of logic circuit 14, as long as the check symbol output can be distinguished from the output data.

The output 32 of logic circuit 14 is coupled to the input of driver 24. The output 34 of driver 24 is coupled to off-chip data output 36. Driver 24 may be any means for controllably gating the signal on its input so that this signal is either passed through the driver to its output or is inhibited from passing through. If the input signal is not passed through, a high impedance condition is presented at output 34 of the driver. Driver 24 may therefore comprise any of a number of driver circuits well-known in the art, such as a three state driver or an open-collector type driver. The state of driver 24 is controlled by an enable signal applied at off-chip driver enable pin 38.

The output 40 of check symbol generator 22 is coupled to the input of driver 26, which has the same properties as driver 24. The state of driver 26 is controlled by an enable signal applied at off-chip driver enable pin 42. The output of driver 26 is coupled to off-chip check symbol output 44.

The output 32 of logic circuit 14 is also coupled to one input 46 of comparator 16. The output 34 of driver 24 is coupled to the other input 48 of comparator 16. Comparator 16 may be any means for detecting inequality between its inputs and responsively generating a signal on its output indicating the inequality. The output of comparator 16 is coupled to off-chip data error output 50.

The output 40 of check symbol generator 22 is also coupled to one input 52 of comparator 18, which has the same properties as comparator 16. The output of driver 26 is coupled to the other input 54 of comparator 18. The output of comparator 18 is coupled to off-chip check symbol error output 56.

Although error outputs 31, 50, and 56, are all shown as off-chip outputs in this embodiment, the error signals from the pre-checking circuitry and the comparators may be latched and collected on the chip to form a common error signal. Scan paths may then be used to examine individual errors signals for fault location. This approach is used where the number of off-chip pins is critical. Similarly, although separate input and output pins are shown in this embodiment, bidirectional I/O pins may be used to reduce pin count. When an I/O line is in input mode, the comparator outputs are disabled (e.g., by internally gating the outputs). Also it should be apparent that the two off-chip driver enable pins 38 and 42 can be replaced by one pin (and an on-chip inverter) to provide complementary enables for drivers 24 and 26. Referring to FIG. 2, two cross-coupled integrated circuit chips 10 and 70 are shown. Chips 10 and 70 are each identical to chip 10 described with reference to FIG. 1. It will be understood, however that these chips need not always be identical in all respect as long as their logic processors are functionally equivalent.

Chips 10 and 70 are cross-coupled by connecting the data and check symbol inputs in parallel to the corresponding input pins on each chip, connecting the off-chip data outputs to each other, and connecting the off-chip check symbol outputs to each other. Thus, in FIG. 2, the externally-supplied input data is coupled to off-chip data input 28 of chip 10 and to off-chip data input 72 of chip 70. The externally-supplied check symbol is coupled to off-chip check symbol input 30 of chip 10 and to off-chip check symbol input 74 of chip 70. Off-chip data output 36 of chip 10 is coupled to off-chip data output 76 of chip 70 and to external data output line 78. Off-chip check symbol output 44 of chip 10 is coupled to off-chip check symbol output 80 of chip 70 and to external check symbol output line 82.

As shown in FIG. 2., the drivers on each chip are configured in a complementary manner. In the figure, the enable lines are omitted and a dotted line indicates a driver in its inhibiting state, i.e., high impedance output, and a solid line indicates an enabled driver. On chip 10, driver 24 is enabled and driver 26 is disabled. On chip 70, driver 84 is enabled and driver 86 is disabled. (It will now be understood that the two off-chip driver enable pins on each chip can be combined into a single pin for configuring the drivers in either of these two complementary states, with one driver enabled and the other driver disabled.)

In this cross-coupled configuration, neither chip is the master and neither chip is the slave. Both chips participate in driving output signals to the rest of the system and both chips check the output driven by the other chip by comparing it to internally generated results. Specifically, chip 10 drives the output data and chip 70 drives the corresponding check symbol; chip 70 checks the output data and chip 10 checks the check symbol.

In operation, with driver 24 enabled, the output data from logic circuit 14 of chip 10 is transmitted to the rest of the system on line 78. This output data is also transmitted to off-chip data output 76 of chip 70, where it is transmitted to one input of comparator 88. With driver 86 disabled, the output data from logic circuit 90 is blocked from reaching off-chip data output 76, but the output data of logic circuit 90 is transmitted to the second input of comparator 88. Thus comparator 88 compares the output data from logic circuit 90 to the output data from logic circuit 14, and, if these outputs are not equal, an error signal is generated on off-chip data error output 96. With driver 84 enabled, the check symbol from check symbol generator 98 of chip 70 is transmitted to the rest of the system on line 82. This check symbol is also transmitted to off-chip check symbol output 44 of chip 10, where it is transmitted to one input of comparator 18. With driver 16 disabled, the check symbol from check symbol generator 22 is inhibited from reaching off-chip check symbol output 44, but the check symbol from check symbol generator 22 is transmitted to the other input of comparator 18. Comparator 18 compares the check symbol from check symbol generator 22 to the check symbol from check symbol generator 98 and, if these check symbols are not equal, an error signal is generated on off-chip check symbol error output 56.

It can now be understood how the invention provides protection against latent faults. If chip 10 fails, comparator 88 of chip 70 will detect an error. If chip 70 fails, comparator 18 of chip 10 will detect an error. Additionally, in this embodiment, chips 10 and 70 form a self-checking network. If a comparator fails to detect an error, the error can still be detected by subsequent circuitry using the check symbol. It should be noted that parity checking and other such hardware error protection using error detection codes is incorporated into many systems, and does not represent an additional cost imposed by this embodiment of the invention.

Additionally, note that if the chips 10 and 70 are identical, each carries the comparators 16 and 89, respectively. These comparators (16 and 89) can be used secondarily, with the signals produced by their counterpart comparators 18 and 88 for additional checking and error localization. For example, comparator 16 would not normally indicate an error, even if the logic circuit 14 (or 90) fails. However, if both comparators 16 and 88 report errors, it is likely that the error lies in driver 24 or the output data bus 78 (i.e., corruption on the bus).

The off-chip error outputs are connected to a maintenance processor (not shown) for analysis and response. Certain timing considerations should be taken into account. In the embodiment shown and described herein, transient error indications may be asserted by the comparator because of the difference in time for the comparator inputs to arrive at the comparator. The internal input signal from the same chip will arrive before the input signal from the other chip. The off-chip error output signals are not valid, and should not be sampled, until both input signals have arrived and the off-chip error output signals reflect the result of the comparison of these input signals. Because this delay can significantly increase the cycle time, it is preferable, for some applications, to latch the comparator input signals. For example, with reference to FIG. 1, latches or registers can be provided at comparator inputs 46, 48, 52, and 54. The comparison of input signals can be performed one clock cycle after the generation of these signals, while new values are being generated.

In summary, the present invention provides a cross-coupled checking circuit in which two modules each participate in driving the outputs and in checking the output driven by the other module. The invention further provides a design for a single integrated circuit chip, two of which can be configured to form a cross-coupled checking circuit. Although the invention has been described herein in terms of a specific embodiment, it will be understood that variations of this embodiment may be made without departing from the scope of the invention. For example, while the output in this embodiment is partitioned into data and check symbol portions for cross-checking, other partitioning of the output (e.g. into two data portions) is possible. The true scope of the invention is therefore defined by the following claims.

We claim:

1. In a circuit for generating digital output data and digital check symbol data, a cross-coupled checking circuit for checking the output data and the check symbol data, said circuit comprising:
   a first
   integrated circuit comprising:
      an off-chip data output;
      an off-chip check symbol input;
      first logic means coupled to the off-chip data output for generating output data at the off-chip data output;
      first check symbol generating means connected to the first logic means for receiving the output data and generating the check symbol data from the output data; and
      a first comparator having one input coupled to the first check symbol generating means and having a second input coupled to the off-chip check symbol input;
   a second integrated circuit comprising:
      second logic means for generating output data;
      an off-chip check symbol output;
      an off-chip data input;
      second check symbol generating means coupled to the second logic means for receiving the output data and for generating the check symbol data from the output data at the off-chip check symbol output; and
      a second comparator having one input coupled to the second logic means and having a second input coupled to the off-chip data input;
   means for coupling the off-chip data output of the first integrated circuit to the off-chip data input of the second integrated circuit; and
   means for coupling the off-chip check symbol output of the second integrated circuit to the off-chip check symbol input of the first integrated circuit; whereby said first integrated circuit drives the data output and checks the check symbol output and said second integrated circuit drives the check symbol output and checks the data output.

2. The circuit of claim 1 wherein said second logic means comprises:
   means functionally equivalent to said first logic means.

3. The circuit of claim 1 wherein the first integrated circuit further comprises means responsive to an externally-supplied signal for configuring the first integrated circuit to use its off-chip data output as an off-chip data input and to use its off-chip check symbol input as an off-chip check symbol output; whereby the first and second integrated circuits may be identical integrated circuit chips.

4. The circuit of claim 3 wherein said first integrated circuit and said second integrated circuit have off-chip data inputs coupled to each other and to an input data source.

5. The circuit of claim 4 wherein said first integrated circuit and said second integrated circuit have off-chip data outputs coupled to each other and off-chip check symbol outputs coupled to each other.

6. The circuit of claim 1 wherein the off-chip data output of the first integrated circuit and the off-chip data input of the second integrated circuit each comprise N pins where N is an integer; and the off-chip check symbol output of the second integrated circuit and the off-chip check symbol input of the first integrated circuit each comprise M pins where M is an integer less than N.

7. An integrated circuit adapted to be coupled to an identical integration circuit to generate and check a data output and a check symbol output, the circuit comprising:
   a logic circuit having a data output and a check symbol output for outputting data and a check symbol corresponding to the data;
   first comparing means for comparing input signals, said first comparing means having a first input coupled to the data output of said logic circuit and having a second input;
   an off-chip data output coupled to the second input of said first comparing means;
   first gating means having an input coupled to the data output of said logic circuit and having an output coupled to the off-chip data output for controllably coupling the data output of said logic circuit to the off-chip data output;
   second comparing means for comparing input signals, said second comparing means having a first input coupled to the check symbol output of said logic circuit and having a second input;
   an off-chip check symbol output coupled to the second input of said second comparing means;
   second gating means having an input coupled to the check symbol output of said logic circuit and having an output coupled to the off-chip check symbol output for controllably coupling the check symbol output of said logic circuit of the off-chip check symbol output;
   first off-chip enable means coupled to said first gating means for receiving a signal for controlling said first gating means; and second off-chip enable means coupled to said second gating means for receiving a signal for controlling said second gating means independently of said first gating means;

whereby the integrated circuit may be configured by applying signals to the first and second off-chip enable means to couple only one of the logic circuit outputs to an off-chip output, thereby permitting the other off-chip output to be used as an input for passing a signal to a comparing means, and an identical integrated circuit configured in a complementary manner may be coupled in parallel to the first integrated circuit such that one integrated circuit drives the data output and compares the check symbols while the other integrated circuit drives the check symbol output and compares the data.

8. The integrated circuit of claim 7 wherein said logic circuit comprises:
   means coupled to said logic circuit data output for generating output data; and
   means coupled to said logic circuit check symbol output for generating a check symbol corresponding to said output data.

9. The integrated circuit of claim 7 wherein said first and second gating means are three-state drivers.

10. The integrated circuit of claim 7 wherein said first and second gating means are open-collector type drivers.

11. The integrated circuit of claim 7 wherein the check symbol is a parity bit.

12. The integrated circuit of claim 7 wherein said logic circuit has at least one input and said circuit further comprises:
   an off-chip data input coupled to the input of said logic circuit;
   an off-chip check symbol input; and
   prechecking means having a first input coupled to said off-chip data input and having a second input coupled to said off-chip check symbol input for checking input data for errors.

13. An integrated circuit adapted to be coupled to an identical integrated circuit to generate and check a data output and a check symbol output, the circuit comprising:
   logic means for generating output data, said logic means having at least one input and having a data output;
   means coupled to the output of said logic means and having a check symbol output, for generating a check symbol corresponding to said output data at the check symbol output;
   a first comparator having a first input coupled to the data output of said logic circuit and having a second input;
   an off-chip data output coupled to the second input of said first comparator;
   first gating means having an input coupled to the data output of said logic circuit and having an output coupled to the off-chip data output;
   first off-chip enable means coupled to said first gating means for receiving a signal for controlling said first gating means;
   a second comparator having a first input coupled to the check symbol output of said check symbol generating means and having a second input;
   an off-chip check symbol output coupled to the second input of said second comparator;
   second gating means having an input coupled to the check symbol output of said check symbol generating means and having an output coupled to the off-chip check symbol output for controllably coupling the check symbol output of said check symbol generating means to the off-chip check symbol output;
   second off-chip enable means coupled to said second gating means for receiving a signal for controlling said second gating means independently of said first gating means;
   an off-chip data input coupled to the input of said logic circuit;
   an off-chip check symbol input; and
   prechecking means having a first input coupled to said off-chip data input and having a second input coupled to said off-chip check symbol input for checking input data for errors;

whereby the integrated circuit may be configured by applying signals to the first and second off-chip enable means to couple either the data or the check symbol to an off-chip output, thereby permitting the other off-chip output to be used as an input for passing a signal to a comparator, and an identical integrated circuit configured in a complementary manner may be coupled in parallel to the first integrated circuit such that one integrated circuit drives the data output and compares the check symbols while the other integrated circuit drives the check symbol output and compares the data.

14. An integrated circuit adapted to be coupled to an identical integrated circuit to generate and check a data output and a check symbol output, the circuit comprising:
   a logic circuit having a data output and a check symbol output for outputting data and a check symbol corresponding to the data;
   first comparing means for comparing input signals, said first comparing means having a first input coupled to the data output of said logic circuit and having a second input;
   an off-chip data output coupled to the second input of said first comparing means;
   first gating means having an input coupled to the data output of said logic circuit and having an output coupled to the off-chip data output for controllably coupling the data output of said logic circuit to the off-chip data output;
   second comparing means for comparing input signals, said second comparing means having a first input coupled to the check symbol output of said logic circuit and having a second input;
   an off-chip check symbol output coupled to the second input of said second comparing means;
   second gating means having an input coupled to the check symbol output of said logic circuit and having an output coupled to the off-chip check symbol output for controllably coupling the check symbol output of said logic circuit to the off-chip check symbol output;
   off-chip enable means coupled to said first gating means and to said second gating means for receiving a control signal, said control signal causing one of said gating means to couple its input to its output while causing the other one of said gating means to decouple its input from its output;

whereby the integrated circuit may be configured by applying a control signal to the off-chip enable means to couple either the data or the check symbol to an off-chip output, thereby permitting the other off-chip output to be used as an input for passing a signal to a comparator, and an identical integrated circuit configured in a complementary manner may be coupled in parallel to the first integrated circuit such that one integrated circuit drives the data output and compares the check symbols while the other integrated circuit drives the check symbol output and compares the data.

15. In a circuit for generating digital output data and digital check symbol data, a cross-coupled checking circuit for checking the output data and the check symbol data, said circuit comprising:
  a first module comprising:
    an external data output;
    an external check symbol input;
    first logic means coupled to the external data output for generating output data at the external data output;
    first check symbol generating means connected to the first logic means for receiving the output data and generating the check symbol data from the output data; and
    a first comparator having one output coupled to the first check symbol generating means and having a second input coupled to the external check symbol input;
  a second module comprising:
    second logic means for generating output data;
    an external check symbol output;
    an external data input;
    second check symbol generating means coupled to the second logic means for receiving the output data and for generating the check symbol data from the output data at the external check symbol output; and
    a second comparator having one input coupled to the second logic means and having a second input coupled to the external data input;
  means for coupling the external data output of the first module to the external data input of the second module; and
  means for coupling the external check symbol output of the second module to the external check symbol input of the first module;
  whereby said first module drives the data output and checks the check symbol output and said second module drives the check symbol output and checks the data output.

* * * * *